(12) United States Patent
Ziger

(10) Patent No.: US 7,842,439 B2
(45) Date of Patent: Nov. 30, 2010

(54) CALIBRATION OF OPTICAL LINE SHORTENING MEASUREMENTS

(75) Inventor: David Ziger, San Antonio, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/424,229

(22) Filed: Apr. 15, 2009

(65) Prior Publication Data

US 2009/0198468 A1 Aug. 6, 2009

Related U.S. Application Data

(62) Division of application No. 10/964,376, filed on Oct. 13, 2004, now Pat. No. 7,541,121.

(51) Int. Cl.
G03F 1/00 (2006.01)
(52) U.S. Cl. .............................. 430/5; 430/30
(58) Field of Classification Search .............. 430/5, 430/22, 30; 356/401; 355/53, 55; 250/492.2; 702/32
See application file for complete search history.

(56) References Cited

U.S. PATENT DOCUMENTS

| | | | |
|---|---|---|---|
| 5,674,650 A * | 10/1997 | Dirksen et al. ............... | 430/22 |
| 5,757,507 A | 5/1998 | Ausschnitt et al. | |
| 5,798,192 A | 8/1998 | King et al. | |
| 5,902,703 A | 5/1999 | Leroux et al. | |
| 5,962,173 A | 10/1999 | Leroux et al. | |
| 6,301,008 B1 | 10/2001 | Ziger et al. | |
| 6,569,584 B1 | 5/2003 | Ho et al. | |
| 6,800,403 B2 | 10/2004 | Leroux et al. | |
| 7,096,127 B2 | 8/2006 | Ziger et al. | |
| 7,108,946 B1 | 9/2006 | Lukanc et al. | |
| 2001/0017693 A1 | 8/2001 | Zheng et al. | |
| 2002/0172876 A1 | 11/2002 | Baselmans | |
| 2003/0129509 A1 | 7/2003 | Yamaguchi | |
| 2004/0241558 A1 * | 12/2004 | Garcia et al. ............... | 430/5 |
| 2005/0012928 A1 | 1/2005 | Sezginer et al. | |
| 2005/0164096 A1 | 7/2005 | Hong et al. | |

OTHER PUBLICATIONS

Ausschnitt, C.P., "Distinguishing dose from defocus for in-line lithography conrol," Part of the SPIE Conference on Metrology, Inspection, and Process Control for Microlithography XIII, SPIE vol. 3677, Mar. 1999, pp. 140-147.
Leroux, P., et al., "Focus Characterization Using End of Line Metrology," IEEE Transactions on Semiconductor Manufacturing, vol. 13, No. 3, Aug. 2000, pp. 322-330.
Ziger, D., et al., "Understanding optical end of line metrology," 2000 Society of Photo-Optical Instrumentation Engineers, vol. 39, No. 7, Jul. 2000, pp. 1951-1957.
Ueno, A., et al., "Novel at-Design-Rule Via-to-Metal Overlay Metrology for 193-nm Lithography," IEEE Transactions on Semiconductor Manufacturing, vol. 17, No. 3, Aug. 2004, pp. 311-316.

* cited by examiner

Primary Examiner—Mark F Huff
Assistant Examiner—Stewart A Fraser
(74) Attorney, Agent, or Firm—Slater & Matsil, L.L.P.

(57) ABSTRACT

A system and method of calibrating optical line shortening measurements, and lithography mask for same. The lithography mask comprises a plurality of gratings, with a calibration marker disposed within each grating. The mask is used to pattern resist on a semiconductor wafer for purposes of measuring and calibrating line shortening. The pattern on the wafer is measured and compared to measurements made of the pattern on the mask. The difference gives the amount of line shortening due to flare, and may be used to calibrate line shortening measurements made using optical measurement tools.

16 Claims, 3 Drawing Sheets

US 7,842,439 B2

CALIBRATION OF OPTICAL LINE SHORTENING MEASUREMENTS

This application is a divisional of patent application Ser. No. 10/964,376, entitled "Calibration of Optical Line Shortening Measurements," filed on Oct. 13, 2004, now U.S. Pat. No. 7,541,121, which application is incorporated herein by reference.

CROSS-REFERENCE TO RELATED APPLICATIONS

This application relates to the following and commonly assigned U.S. patent application: Ser. No. 10/964,102, filed Oct. 13, 2004 and issued as U.S. Pat. No. 7,096,127, entitled "Measuring Flare in Semiconductor Lithography," which application is hereby incorporated herein by reference.

TECHNICAL FIELD

The present invention relates generally to lithography of semiconductor devices, and more particularly to the calibration of line shortening measurements.

BACKGROUND

Semiconductor devices are manufactured by depositing many different types of material layers over a semiconductor workpiece or wafer, and patterning the various material layers using lithography. The material layers typically comprise thin films of conductive, semiconductive and insulating materials that are patterned to form integrated circuits.

One type of semiconductor lithography involves placing a patterned mask between a semiconductor workpiece and using an energy source to expose portions of a resist deposited on the workpiece, transferring the mask pattern to the resist. The resist is then developed, and the resist is used as a mask while exposed regions of a material on the workpiece are etched away.

As semiconductor devices are scaled down in size, lithography becomes more difficult, because light can function in unexpected and unpredictable ways when directed around small features of a mask. Several phenomenon of light can prevent the exact duplication of a mask pattern onto a wafer, such as diffraction, interference, or flare, as examples.

In many designs, the individual features of a circuit, such as gate lines or signal lines, as examples, have extremely small dimensions and may have widths of about 0.1 to 0.4 µm or less, with their lengths being considerably greater than the widths, e.g., about 0.8 to 2.0 µm or greater, for example. These thin lines may be connected to other layers of the integrated circuit by narrow vias filled with conductive material. When dimensions reach such a small size, there is not only a tendency for a line formed on a wafer to be shorter than its design length as defined by the lithography mask, but also the positioning of the vias may not be aligned to the target structures. Transfer differences of such critical dimensions occur when a desired circuit feature is particularly thin or small because of various optical effects. The accuracy of forming and positioning the lines and the vias becomes increasingly critical as dimensions decrease. Relatively minor errors in positioning such features can cause a via to miss the line altogether or to contact the line over a surface area that is insufficient to provide the necessary conductivity for a fully functional circuit. Thus, it is important to determine the effects of and to account for line shortening using optical measurements.

In the measurement of line shortening, gratings can be used to determine best focus and exposure dose, as described in an article entitled, "Focus Characterization Using End of Line Metrology," by Leroux et al., in IEEE Transactions on Semiconductor Manufacturing, Vol. 13, No. 3, August 2000, pp. 322-330, and in an article entitled, "Distinguishing Dose From Defocus for In-Line Lithography Control," by Ausschnitt, in Proc. SPIE, Vol. 3677, pp. 140-147, which are incorporated herein by reference. The ends of the thin lines of a grating structure are sensitive to focus, yet are "seen" as a solid line by an optical metrology tool using white light. The ends of lines appear as a solid line because the wavelength of the light is significantly larger than the printed features.

FIG. 1A shows a prior art sub-resolution grating pattern on a lithography mask. When imaged on a wafer or workpiece and viewed with white light on a wafer, an optical tool interprets the ends of the sub-resolution grating 209 lines as a solid line, as shown in FIG. 1B. However, when viewed with a scanning electron microscope (SEM), the gratings are visible, and the ends of the sub-resolution grating 209 lines appear as a single, somewhat ragged line, as shown in FIG. 1C. Because the lines and spaces of the grating on the mask 208 are smaller than the wavelength of light used in an optical microscope, the pattern formed on the workpiece is not visible by an optical tool, as shown in FIG. 1B. For example, the lines and spaces of the grating pattern 209 may be about 0.12 to 0.15 µm, and white light used in an optical microscope to view the workpiece may comprise a wavelength of about 650 nm or less, which is too large to resolve the pattern. However, a SEM has a higher resolution and can detect the pattern formed on the workpiece, and thus a SEM must be used to measure the pattern on the workpiece.

Though an optical alignment tool can measure the relative line shortening, the measurements are sensitive to pitch and contrast, as described in an article entitled, "Understanding Optical end of Line Metrology," by Ziger, et al., in Opt. Eng., July 2000, Vol. 39, No. 7, pp. 1951-1957, which is incorporated herein by reference. For certain applications, a relative measurement is all that is required to measure line shortening. As an example, optimum focus can be determined from the minimum line shortening a modified box-in-box structure, as described in the article "Focus Characterization Using End of Line Metrology," previously referenced herein. However, the actual line shortening and line shortening optically measured are quite different due to diffraction effects.

There are applications using gratings that are read with optical tools, for which an absolute value of line shortening is desirable. For example, in U.S. Pat. No. 5,962,173, issued on Oct. 9, 1999, entitled, "Method for Measuring the Effectiveness of Optical Proximity Corrections," which is incorporated herein by reference, Leroux, et al. describe a method for measuring optical proximity effect using a modified box in box structure that contains gratings which are read using an optical measuring instrument. This method requires calibration of the optical metrology tool to ensure that the measurements are correct.

In U.S. Pat. No. 6,301,008, issued on Oct. 9, 2001, entitled, "Arrangement and Method for Calibrating Optical Line Shortening Measurements," which is also incorporated herein by reference, Ziger et al. describe an approach to calibrate optical and SEM-based measurements. However, this approach requires a correlation between actual and optical measurements as a function of pitch and line size.

Although more accurate, using a SEM to make measurements of line shortening in production is not practical, because they are time-consuming and would result in decreased throughput. Thus, it is desirable to use optical measurement tools for measurement of line shortening in production.

What is needed in the art are improved methods of calibrating line shortening measurements of optical measurement or metrology tools in semiconductor lithography systems.

SUMMARY OF THE INVENTION

These and other problems are generally solved or circumvented, and technical advantages are generally achieved, by preferred embodiments of the present invention, which provide improved methods of calibrating line shortening measurements. A lithography mask comprises a grating structure, with a calibration marker placed within each grate. The marker is small enough to be unresolvable by optical wavelengths, and provides an absolute measurement of line shortening, which can be used to calibrate optical measurements made by optical metrology tools.

In accordance with a preferred embodiment of the present invention, a lithography mask for calibrating line shortening measurements includes a transparent substrate, and an opaque material disposed on the substrate. The opaque material includes a test pattern, the test pattern comprising a plurality of gratings, at least one of the gratings comprising a calibration marker disposed therein.

In accordance with another preferred embodiment of the present invention, a method of calibrating line shortening measurements includes providing a semiconductor workpiece, the workpiece comprising a layer of photosensitive material disposed thereon, and exposing the layer of photosensitive material to energy through at least one mask, the at least one mask comprising a first test pattern and a second test pattern disposed proximate a portion of the first test pattern, the second test pattern comprising an opaque or attenuated region, the first test pattern comprising a plurality of gratings, wherein a calibration marker is disposed within at least one of the gratings. The method includes developing the layer of photosensitive material, measuring features formed on the photosensitive material by the first test pattern proximate the second test pattern to determine a first line shortening measurement, and measuring the length of at least one grating of the first test pattern of the at least one mask. A first side of the at least one grating formed by the at least one grating of the first test pattern on the photosensitive material is measured between a calibration marker and an end of the grating, and a second side of the at least one grating formed by the at least one grating of the first test pattern on the photosensitive material is measured between the calibration marker and the other end of the grating. The method includes determining the difference D1 of the first side measurement and the mask measurement, determining the difference D2 of the second side measurement and the mask measurement, and determining the difference of D1 and D2 to determine a second line shortening measurement. The second line shortening measurement is compared to the first line shortening measurement to determine a calibration factor for line shortening measurements.

In accordance with yet another preferred embodiment of the present invention, a system for calibration of line shortening measurements includes a semiconductor workpiece, the workpiece comprising a layer of photosensitive material disposed thereon, and at least one mask, the at least one mask comprising a first test pattern and a second test pattern disposed proximate a portion of the first test pattern, the second test pattern comprising an opaque or attenuated region, the first test pattern comprising a plurality of gratings, wherein a calibration marker is disposed within at least one of the gratings. The system includes an exposure tool for exposing the layer of photosensitive material to energy through the at least one mask, and a developing tool for developing the layer of photosensitive material. The system includes at least one measurement tool for measuring features formed on the photosensitive material by the first test pattern proximate the second test pattern to determine a first line shortening measurement, for measuring the length of at least one grating of the first test pattern of the at least one mask, for measuring a first side of the at least one grating formed by the at least one grating of the first test pattern on the photosensitive material between a calibration marker and an end of the grating, and for measuring a second side of the at least one grating formed by the at least one grating of the first test pattern on the photosensitive material between the calibration marker and the other end of the grating. The system includes a processor adapted to determine the difference D1 of the first side measurement and the mask measurement, the difference D2 of the second side measurement and the mask measurement, the difference of D1 and D2 to determine a second line shortening measurement; and adapted to compare the second line shortening measurement to the first line shortening measurement to determine a calibration factor for line shortening measurements.

Advantages of embodiments of the present invention include providing improved methods of calibrating line shortening measurements. An absolute distance between a marker and the end of a line is measured, providing an absolute line shortening measurement. The effects of diffraction can be segregated, and the effects of flare in line shortening can be distinguished. The resulting calibration factor can be used to correct or calibrate measurements taken by an optical metrology tool. The method reduces the amount of error in the measurement of line shortening.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely lithography of semiconductor devices. The invention may also be applied, however, to other technologies that require lithography in the manufacturing process, for example.

Figure 1A:
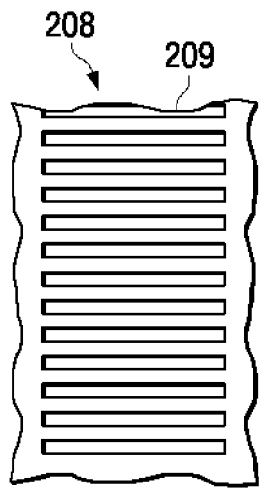
FIG. 1A shows a sub-resolution grating pattern formed on a lithography mask.
Figure 1B:
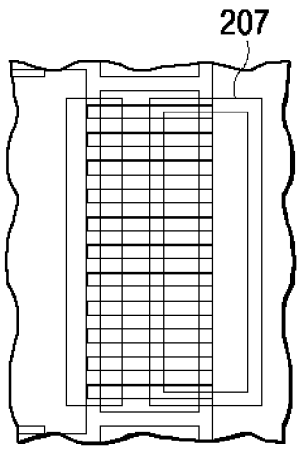
FIG. 1B shows the grating pattern of FIG. 1A formed on a resist of a semiconductor wafer, as viewed from an optical microscope.
Figure 1C:
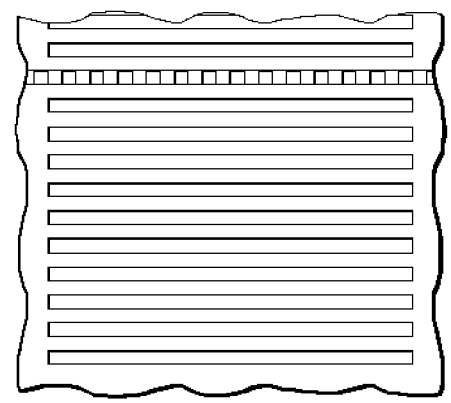
FIG. 1C shows the grating pattern of FIG. 1A when detected by a SEM at a low resolution.
Figure 2A:
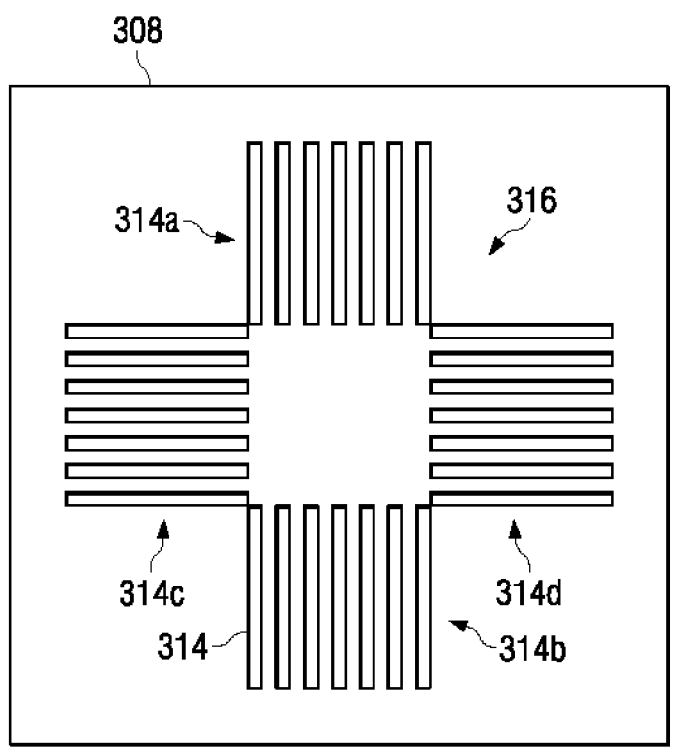
FIG. 2A shows a lithography mask having a flare-sensitive pattern formed thereon which may be used to expose a resist of a semiconductor workpiece.

In U.S. patent application, Ser. No. 10/964,102, filed concurrently herewith, and issued as U.S. Pat. No. 7,096,127, entitled "Measuring Flare in Semiconductor Lithography," which is hereby incorporated herein by reference, flare is measured by exposing a resist on a semiconductor workpiece using a lithography mask 308 having a flare sensitive first test pattern formed thereon, as shown in FIG. 2A, and asymmetrically exposing the resist using a block-shaped opaque second test pattern, using a mask pattern such as the one shown in FIG. 2B. As described in this related patent application, the first test pattern may comprise a plurality of parallel opaque regions or gratings 314 in an otherwise transparent mask arranged in rows 314a and 314b and columns 314c and 314d, as shown. If there is flare in the lithography system, the corner of the resist patterned by the first test pattern closest to the opaque second test pattern will be exposed to more stray light due to flare, and will exhibit line shortening on gratings of the first test pattern in that corner on a resist on a wafer. The amount of flare is determined by measuring the patterned region of the test pattern on the resist close to the opaque test pattern, compared to the patterned region of the test pattern farther from the opaque test pattern, in one embodiment. The difference represents the amount of flare in the optical system. The effect of exposure to the two test patterns is that one corner of the gratings formed on a resist is prone to additional end of line shortening due to flare compared to the opposite corner. An optical alignment measuring tool is used to determine the relative grating widths.

However, in addition to flare, the optical measurement tool itself also has diffraction effects. Thus, not all of the line shortening that is measured by the optical alignment measuring tool may be due to flare. Therefore, the lithography system needs to be calibrated to SEM measurements in order to ensure that the line shortening measured is due to flare. However, the gratings of the first test pattern are too long to be measured accurately using a SEM, and thus, a method of accurately calibrating the optical measurements is needed.

Embodiments of the present invention achieve technical advantages by disposing calibration markers within the gratings of the first test pattern so that a SEM can measure the absolute distance between the calibration marker and the end of the line, e.g., the grating. The calibration markers are preferably sufficiently small so that the calibration markers cannot be resolved by the optical wavelengths used by the optical measurement tool. Knowing the layout of the calibration markers, e.g., by measuring the grating on the mask having the flare sensitive test pattern from the calibration marker to the end of the grating with a SEM, provides the user with the absolute line shortening, which can then be used to calibrate optical measurements of line shortening made by an optical measurement tool.

Figure 3:
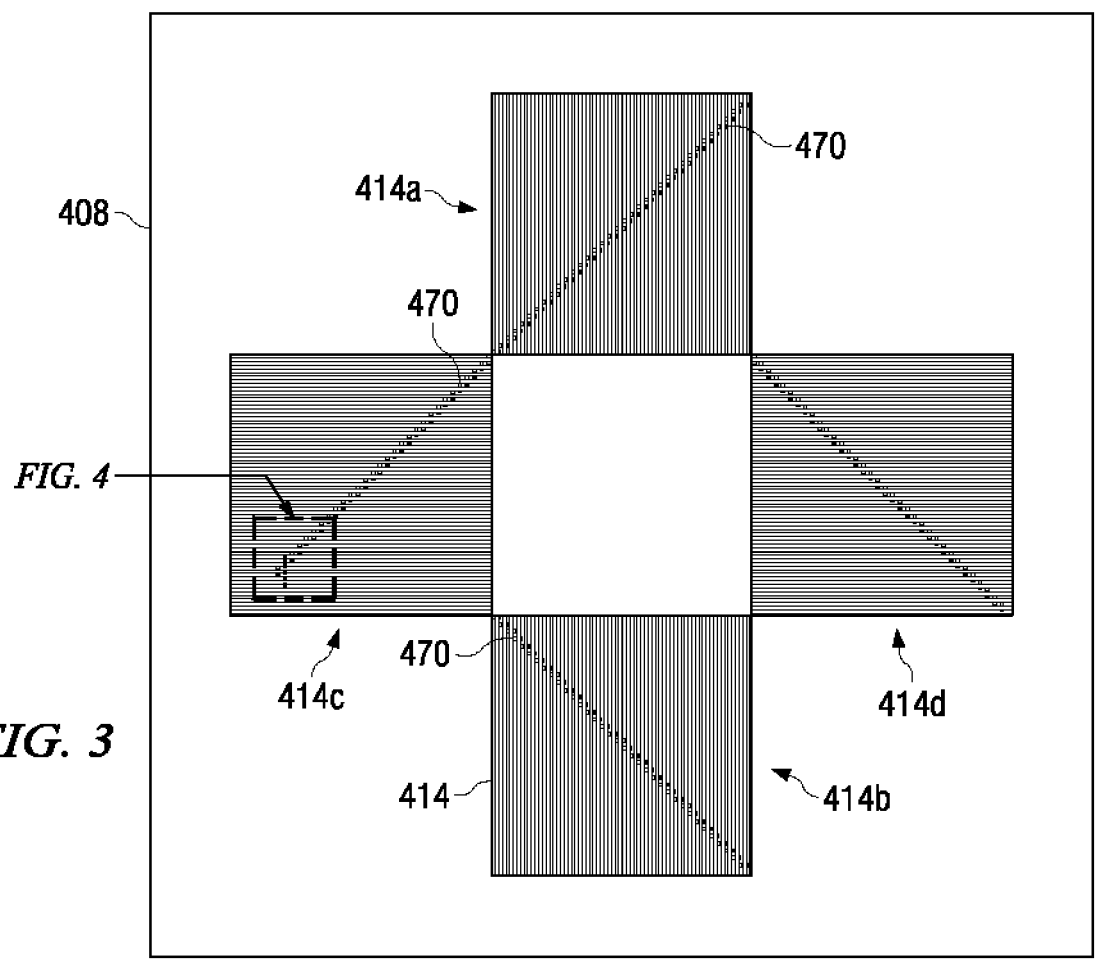
FIG. 3 shows a lithography mask in accordance with an embodiment of the present invention, wherein a flare sensitive pattern comprises a box-in-box grating structure including a calibration marker in each grating, wherein the calibration markers may be used for calibration of optical metrology tools.

FIG. 3 shows an example of an embodiment of the present invention as applied to the flare box test pattern shown in FIG. 2A. An array of calibration markers 470 is placed in each grating pattern 414a, 414b, 414c, or 414d. Preferably, all of the calibration markers 470 are not placed in the same location in the plurality of gratings 414; otherwise, an optical measurement instrument would detect or "see" the markers. The calibration markers 470 are preferably placed diagonally within the gratings within a row or column, in one embodiment. However, the calibration markers 470 may be positioned in any number of designs; e.g., any design preferably not having a substantially horizontal or vertical line shape. Preferably, in one embodiment, the calibration markers 470 each comprise a different location within a grating 414 for a single row 414a or 414b or column 414c or 414d than every other grating 414 in each row 414a or 414b or column 414c or 414d.

In the example shown in FIG. 3, the calibration markers 470 comprise rectangular contacts comprising transparent regions in each opaque grating 414. However, the calibration markers 470 may alternatively comprise other shapes, such as circles, ellipses, or trapezoids, as examples, although the calibration markers 470 may also comprise other shapes. An enlarged view of a portion of the mask 408 is shown in FIG. 4.

Figure 4:
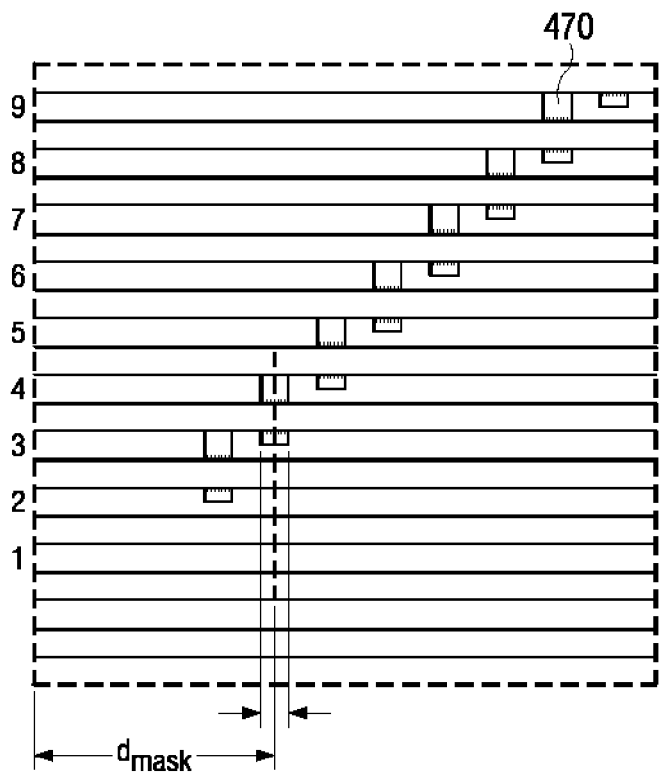
FIG. 4 shows a more detailed view of a portion of the flare sensitive pattern shown in FIG. 3, showing an enlargement of the calibration markers and the distance to end of the grating lines.
Figure 5:
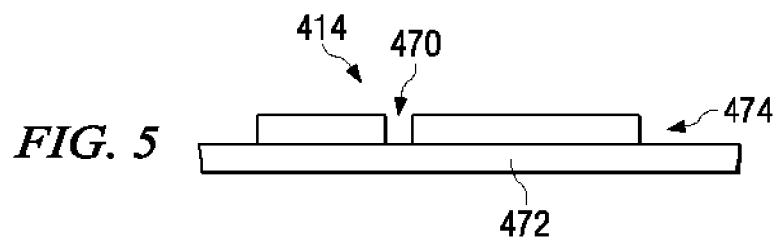
FIG. 5 is a cross-sectional view of the mask shown in FIGS. 3 and 4.

The measurement $d_{mask}$ represents the distance from the middle of a calibration marker 470 to an end of a grating 414, e.g., grating line 4 between lines 3 and 5 in FIG. 4. The distance "$d_{wafer}$" (not shown in the drawings) used herein refers to the distance measured on a grating in the same position within the structure (e.g., the test pattern) formed on a resist on a wafer, e.g., between the center of a calibration marker 470 and an end of a grating, as shown.

In accordance with embodiments of the present invention, the distances $d_{mask}$ and $d_{wafer}$ are measured using a SEM, and the values obtained are compared to determine the amount of line shortening of the lithography system. This information can then be used as a calibration factor for an optical measurement tool, which is later used for measurements of wafers manufactured using the lithography system. The optical measurement tool may comprise a commercially available optical alignment tool, such as the KLA Archer manufactured by KLA Instruments in Santa Clara, Calif., as an example, although alternatively, other measurement means may be used for the optical measurements described herein. The measurements made by the optical measurement tool are adjusted by the calibration factor determined in accordance with embodiments of the present invention, giving a more accurate measurement of line shortening.

An example of an embodiment of the present invention will next be described. The distance between the actual end of the line or grating 414 on the mask 408 and the center of the marker 470 may be tabulated versus an arbitrary line number (e.g., 1, 3, 5, 7, 9 shown in FIG. 4). For example, Table 1 tabulates the distances in μm as a function of the line for a few gratings 414, and shows a compilation of the value $d_{mask}$ for the gratings 414 (lines 3, 4, 5, wherein line 4 is disposed between line 3 and 5) lines shown in FIG. 4.

TABLE 1

| Line | $d_{mask}$ |
|---|---|
| 3 | 0.525 |
| 4 | 0.825 |
| 5 | 1.125 |

Figure 2B:
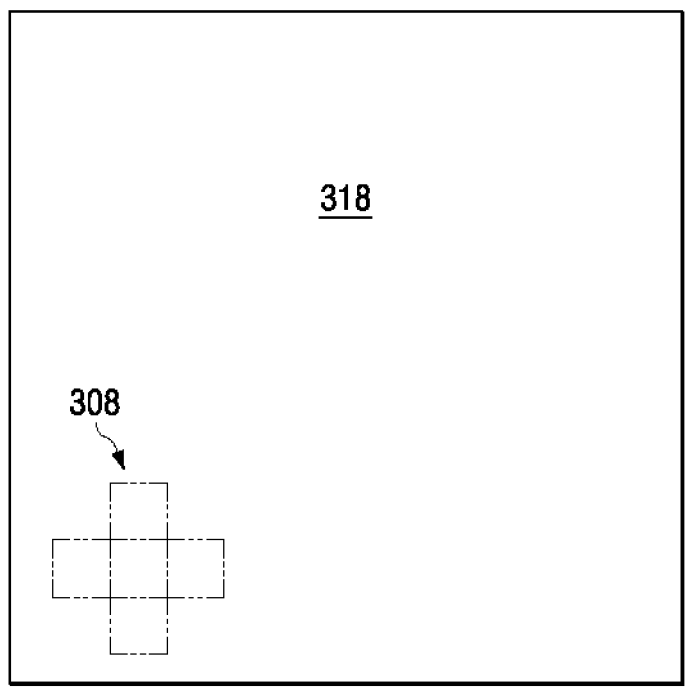
FIG. 2B shows a lithography mask having an opaque pattern that is positioned asymmetrically over a latent image formed on a resist using the lithography mask of FIG. 2A in order to measure the effect of flare.

This is repeated for all edges in which absolute line shortening measurements are desired, e.g., the row 414a or 414b and column 414c or 414d that have been exposed to the second test pattern (as shown in FIG. 2B), to determine the effects of flare. In the absence of mask fabrication errors, this tabulation can be done from the mask design, e.g., from the dimensions of the design; however, the tabulation can also be done using a SEM measurement of the mask 408, in order to remove mask fabrication errors. After tabulation, the mask 408 is used to pattern or expose a resist on a semiconductor wafer, and the apparent misalignment can be measured using an optical measuring tool.

For a flare test as described with reference to FIGS. 2A and 2B, the alignment shift or line shortening of patterns formed on a resist is attributable to differences in flare caused by exposure to the second test pattern. However, optical measurement of the pattern formed on the resist is not necessarily the actual end of line shortening, due to diffraction effects of the optical measurement tool. To obtain the actual line shortening due to flare, in accordance with an embodiment of the invention, the user measures one or more differences between the ends of the gratings 414 and the center of the marker 470 on an imaged wafer with this pattern. Note that the center of the marker 470 on the wafer can be determined by measuring the width of the marker 470 and offsetting from either edge. The wafer measurements $d_{wafer}$ are then compared to the tabulated values $d_{mask}$ of the mask 408 to determine the difference, which can then be used to determine a calibration factor for line shortening measurements made by an optical metrology tool.

The calibration markers 470 preferably comprise substantially square or rectangular contacts in one embodiment, as shown in FIGS. 3 and 4. However, the calibration markers 470 may comprise other shapes, and may comprise any imperfection. The calibration markers 470 may comprise a minimum feature size of the lithography system, for example. The calibration markers 470 may comprise a width of about 0.14 μm or less, and preferably comprise a width of about 0.10 to 0.14 μm in one embodiment. Each calibration marker 470 may straddle two or more gratings 414, as shown. Preferably, the calibration markers 470 are small enough that an optical measurement tool cannot detect them. However, the calibration markers 470 are large enough that a SEM can detect them. The calibration markers 470 preferably comprise a transparent region or abruption within an otherwise opaque grating 414, for example.

Next, an example an embodiment of the present invention used to calibrate the measurement of flare in the flare measurement system as described with reference to FIGS. 2A and 2B, wherein a first test pattern that is sensitive to flare, and a second test pattern that is opaque and asymmetrically positioned with reference to the first test pattern, are used to expose a resist. Assume that under particular conditions, the measured misalignment conditions in the horizontal direction for three gratings 414 of a mask such as mask 408 shown in FIG. 3, on an optical measuring tool is 0.130 μm, 0.109 μm, and 0.22 μm, as shown in Table 2, below.

TABLE 2

| Line | $d_{mask}$ | $d_{wafer\ left}$ | Left = $d_{wafer\ left} - d_{mask}$ | $d_{wafer\ right}$ | Right = $d_{wafer\ right} - d_{mask}$ | Right-Left | Optical |
|---|---|---|---|---|---|---|---|
| 3 | 0.525 | 0.428 | −0.097 | 0.520 | −0.005 | 0.092 | |
| 4 | 0.825 | 0.721 | −0.104 | 0.820 | −0.005 | 0.100 | |
| 5 | 1.125 | 1.025 | −0.100 | 1.119 | −0.006 | 0.094 | |
| Summary | | | | | | 0.095 | *0.130* |
| 3 | 0.525 | 0.450 | −0.075 | 0.517 | −0.008 | 0.067 | |
| 4 | 0.825 | 0.750 | −0.075 | 0.824 | −0.001 | 0.075 | |
| 5 | 1.125 | 1.049 | −0.076 | 1.118 | −0.007 | 0.069 | |
| Summary | | | | | | 0.070 | *0.109* |
| 3 | 0.525 | 0.348 | −0.177 | 0.520 | −0.005 | 0.172 | |
| 4 | 0.825 | 0.653 | −0.172 | 0.821 | −0.004 | 0.168 | |
| 5 | 1.125 | 0.948 | −0.177 | 1.124 | −0.001 | 0.175 | |
| Summary | | | | | | 0.172 | *0.220* |

SEM measurements are taken of the distance between the end of a grating line 414 and the center of the calibration marker 470 on both the left ($d_{wafer\ left}$) and right ($d_{wafer\ right}$) sides of the calibration marker 470. These measurements are summarized in Table 2 along with the relevant calculations. The dimensions "$d_{wafer\ left}$" and "$d_{wafer\ right}$" represent SEM measurements. The value in the column labeled "optical" in italics indicated the measured optical misalignments.

In the first line of Table 2, "Left=$d_{wafer\ left} - d_{mask}$" (−0.097) indicates the difference of the SEM measurements of $d_{mask}$ (0.525) and $d_{wafer\ left}$ (0.450) for grating line 3. Likewise, "Right=$d_{wafer\ right} - d_{mask}$" (−0.005) indicates the difference of the SEM measurements of $d_{mask}$ (0.520) and $d_{wafer\ right}$ (0.450) for grating line 3. "Right-Left" (0.092) indicates the difference of "Right=$d_{wafer\ right} - d_{mask}$" (−0.005) and "Left=$d_{wafer\ left} - d_{mask}$" (−0.097), which equals 0.092. This process is repeated for one or more gratings 414 in the test pattern. The results are averaged, giving the summary value of "Right-Left" of 0.095, as shown in Table 2, which is the average line shortening according to the SEM results, of the lithography system. The amount of line shortening measured by an optical measurement or metrology tool was 0.130, for the same lithography system. The tests may be repeated a number of times to determine a more accurate calibration factor. The SEM measurements are preferably performed at a relatively high magnification, to reduce magnification errors, for example.

Figure 6:
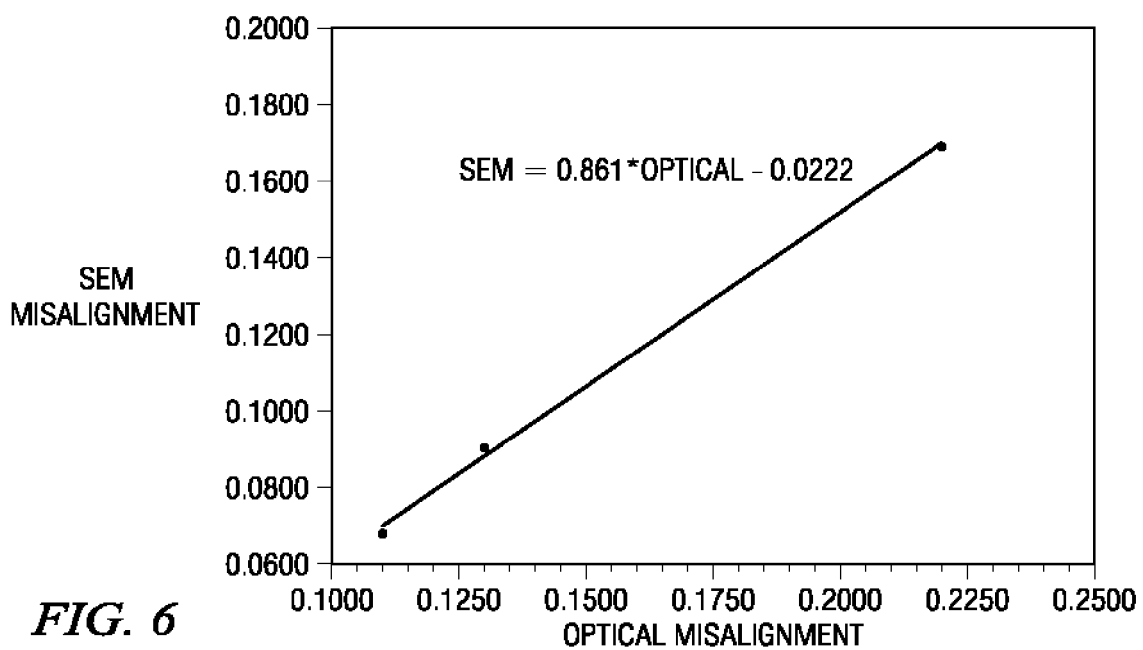
FIG. 6 is a graph showing an example of the correlation of optical and SEM measured misalignments in accordance with an embodiment of the present invention.

FIG. 6 shows the correlation between optical and SEM measurements. These data indicate that the true line shortening as measured with a SEM is roughly 86% that measured optically less a 0.022 constant offset.

The method described herein can be used to calibrate vertical features such as the gratings 414 shown in rows 414a and 414b of FIG. 3, and features comprising other pitches, line sizes, and other shapes, as examples.

In summary, the measurement of line shortening with optical measurement tools has two components; a diffraction component and an actual line shortening component. To obtain the actual line shortening component, a true measurement is needed, which is provided by embodiments of the present invention, with SEM measurements of portions of the gratings between the calibration marker 470 and the ends of the gratings, comparing wafer to mask measurements. The difference between the SEM measurements of the wafer and the mask is the actual line shortening component. The difference between the measurements made by an optical metrology tool and the SEM measurements (of the calibration marker portion of the gratings 414) is the component of line shortening measurement made by the optical measurement tool that is due to diffraction.

The SEM measurements of the portions of the gratings 414 (e.g., from the calibration marker 470 to the end of the grating) are at a high resolution and are highly accurate, because the portions measured are smaller than an entire grating 414, which would be less accurate to measure, at a lower resolution. Because the calibration markers are positioned at different locations within a row or column of gratings 414, the optical measurement tool will not "see" or optically detect the markers. For example, if the calibration markers were placed in the same location within each grating, i.e., if the calibration markers 470 were placed close to the edge of the gratings 414, the calibration marker 470 could be consumed by the line shortening, if there was a large enough amount of line shortening in the system.

Embodiments of the present invention provide methods of calibrating measurements taken with an optical measurement tool. The amount of measurement error due to line shortening is determined using the novel method and lithography tool described herein, and the measurement error is used to calibrate measurements taken by the optical measurement tool. More particularly, measurements taken by an optical measurement tool are adjusted by the calibration factor determined herein.

Advantages of embodiments of the invention include providing improved methods of calibrating line shortening measurements. An absolute distance between a calibration marker and the end of a grating line is measured on a lithography mask and on an image patterned on a resist, providing an absolute line shortening measurement. The effects of diffraction can be distinguished from the effects of flare on line shortening. The method reduces the amount of error in the measurement of line shortening.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography mask for calibrating line shortening measurements, the mask comprising:
    a transparent substrate; and
    an opaque material disposed on the substrate, the opaque material comprising a test pattern, the test pattern comprising a plurality of gratings arranged in a column or row, each of the gratings comprising a calibration marker disposed therein, wherein each calibration marker of each grating is located at a position between a first end and a second end of each grating, and wherein the position of each calibration marker is different than the position of every other calibration marker of the other gratings in the column or row.

2. The lithography mask according to claim 1, wherein the calibration markers are arranged diagonally from grating to grating.

3. The lithography mask according to claim 1, wherein the test pattern comprises a top row of gratings, a bottom row of gratings, a left column of gratings, and a right column of gratings.

4. The lithography mask according to claim 3, wherein the calibration markers are arranged diagonally from grating to grating within a column or row.

5. A lithography mask for calibrating line shortening measurements, the mask comprising:
    a transparent substrate;
    a flare sensitive first test pattern disposed on a first region of the transparent substrate, the flare sensitive first test pattern defining a first area having a first and a second dimension and comprising a plurality of parallel gratings arranged in one of rows and columns and each of said plurality of parallel gratings having a length the same as one of said first and second dimensions;
    calibration markers disposed within each of the plurality of parallel gratings, wherein each calibration marker of each grating is located at a position between a first end and a second end of each grating, and wherein the position of each calibration marker is different than the position of every other calibration marker of the other gratings in the column or row; and
    a second test pattern disposed on a second region of the transparent substrate, said second test pattern comprising an opaque or attenuated region located proximate a portion of the flare sensitive first test pattern.

6. The lithography mask according to claim 5, wherein the first test pattern comprises a top row of opaque gratings, a bottom row of opaque gratings, a left column of opaque gratings, and a right column of opaque gratings.

7. The lithography mask according to claim 6, wherein an area of the opaque or attenuated region of the second test pattern is larger than an area of the opaque portion the first test pattern.

8. The lithography mask according to claim 6, further comprising a plurality of first and second test pattern pairs.

9. The lithography mask according to claim 8, wherein each of the pairs has a different proximity of the first and second test patterns from the other pairs.

10. The lithography mask according to claim 5, wherein the calibration markers are arranged diagonally from grating to grating.

11. The lithography mask according to claim 10, wherein the first test pattern comprises a top row of gratings, a bottom row of gratings, a left column of gratings, and a right column of gratings.

12. The lithography mask according to claim 6, wherein the calibration markers are arranged diagonally from grating to grating within a column or row.

13. A lithography mask, the mask comprising:
a transparent substrate; and
an opaque material disposed on the substrate, the opaque material comprising a test pattern, the test pattern comprising a plurality of gratings, each grating is an opaque region of a plurality of parallel opaque regions, wherein the plurality of gratings are arranged in a column or row, each grating comprises a line shortening calibration marker disposed therein, and each grating comprises a first end and a second end, wherein the line shortening calibration marker of one of the plurality of gratings is located at a predetermined position between the first end and the second end of each grating, wherein the position of the line shortening calibration marker is different than the position of every other line shortening calibration marker of the other gratings in the column or row.

14. The lithography mask according to claim 13, wherein the line shortening calibration markers are arranged diagonally.

15. The lithography mask according to claim 13, wherein the test pattern comprising a top row of gratings, a bottom row of gratings, a left column of gratings, and a right column of gratings.

16. The lithography mask according to claim 15, wherein the line shortening calibration markers are arranged diagonally within a column or row.

* * * * *

UNITED STATES PATENT AND TRADEMARK OFFICE
CERTIFICATE OF CORRECTION

| | | |
|---|---|---|
| PATENT NO. | : 7,842,439 B2 | Page 1 of 1 |
| APPLICATION NO. | : 12/424229 | |
| DATED | : November 30, 2010 | |
| INVENTOR(S) | : Ziger | |

It is certified that error appears in the above-identified patent and that said Letters Patent is hereby corrected as shown below:

In Col. 11, line 5, claim 7, after "portion" insert --of--.

Signed and Sealed this
Seventh Day of June, 2011

David J. Kappos
*Director of the United States Patent and Trademark Office*